(12) United States Patent
Chen et al.

(10) Patent No.: US 7,999,062 B2
(45) Date of Patent: Aug. 16, 2011

(54) SOLUBLE POLYTHIOPHENE DERIVATIVE

(75) Inventors: Chih-Ping Chen, Kaohsiung County (TW); Chao-Ying Yu, Kaohsiung (TW); Ching-Yen Wei, Taipei (TW); Yi-Ling Chen, Chiayi County (TW); Gue-Wuu Hwang, Hsinchu (TW); Ching Ting, Hsinchu (TW); Bao-Tsan Ko, Pingtung (TW); Yi-Chun Chen, Hsinchu (TW); Yu-Ling Fan, Hsinchu County (TW)

(73) Assignee: Industrial Technology Research Institute (TW)

( * ) Notice: Subject to any disclaimer, the term of this patent is extended or adjusted under 35 U.S.C. 154(b) by 5 days.

(21) Appl. No.: 12/492,740

(22) Filed: Jun. 26, 2009

(65) Prior Publication Data

US 2010/0292433 A1    Nov. 18, 2010

(30) Foreign Application Priority Data

May 15, 2009    (TW) ................ 98116138 A

(51) Int. Cl.
*C08G 75/00* (2006.01)
(52) U.S. Cl. ............ 528/377; 528/380; 528/373
(58) Field of Classification Search .......... 528/380, 528/377
See application file for complete search history.

(56) References Cited

U.S. PATENT DOCUMENTS

| 6,107,117 A | 8/2000 | Bao et al. |
| 6,488,555 B2 | 12/2002 | Pichler et al. |
| 6,852,920 B2 | 2/2005 | Sager et al. |

FOREIGN PATENT DOCUMENTS

WO    WO 2007148914 A1 * 12/2007

OTHER PUBLICATIONS

Jianhui Hou et al., "Synthesis and Photovoltaic Properties of Two-Dimensional Conjugated Polythiophenes with Bi(thienylenevinylene) Side Chains," J. Am. Chem. Soc. 128 (2006) 4911.

* cited by examiner

*Primary Examiner* — Randy Gulakowski
*Assistant Examiner* — Shane Fang
(74) *Attorney, Agent, or Firm* — Lowe Hauptman Ham & Berner, LLP

(57) ABSTRACT

The invention discloses soluble polythiophene derivatives containing highly coplanar repeating units. The coplanar characteristic of side chain conjugated thiophene units improves the degree of the intramolecular conjugation and intermolecular $\pi$-$\pi$ interaction. The polythiophene derivative exhibits good carrier mobility and is suitable for use in photoelectronic device such as organic thin film transistors (OTFT), organic light-emitting diodes (OLEDs), and organic solar cells (OSCs).

12 Claims, 1 Drawing Sheet

SOLUBLE POLYTHIOPHENE DERIVATIVE

CROSS REFERENCE TO RELATED APPLICATIONS

This Application claims priority of Taiwan Patent Application No. 98116138, filed on May 15, 2009, the entirety of which is incorporated by reference herein.

BACKGROUND OF THE INVENTION

1. Field of the Invention

The present invention relates to a soluble polythiophene derivative having coplanar groups, and in particular relates to a photoelectric device utilizing the same.

2. Description of the Related Art

Because polymeric semiconductor materials have semiconductor and photoelectric properties, they can be applied in many photoelectric devices such as organic thin-film transistors (abbreviated OTFT), organic solar cells, organic light emitting diodes (abbreviated OLED), and photo sensors. Due to its polymer properties, polymeric semiconductor materials are utilized to form active film coated on photoelectric devices, Photoelectric devices utilizing polymeric semiconductor materials have advantages such as having a light weight, being inexpensive, being easy to fabricate, and flexibility along with suitability for large area fabrication. Conjugated polymer having a conjugated backbone is one of the most popularly used polymeric semiconductor material in photoelectric devices. However, conjugated polymer has disadvantages such as low carrier mobility, and a narrow absorption band of about 400 nm to 650 nm. Therefore, many conjugated polymers are synthesized to enhance carrier mobility and absorption band thereof, to further improve photoelectric efficiency when applied.

For solar cell applications, characteristics such as high electron/hole mobility and wide absorption band are desired for improving the power conversion efficiency thereof. Thus, an electron donor material such as polymer is often combined with an electron acceptor material such as C60 by heterojunction technology. For example, the electron donor material poly(3-hexylthiophene) (abbreviated P3HT) blended with [6,6]-phenyl-C61-butyric acid methyl ester (abbreviated PCBM) has a power conversion efficiency of 3.5%.

P3HT, poly(9,9-dioctylfluorenyl-dithiophene) (abbreviated F8T2), and poly(cyclopentyldithiophene derivative) (abbreviated PCPDTBT) are formed from polymerizing thiophene derivatives, such that the polymers have a cyclo conjugated thiophene backbone. The polymer long chains thereof are attracted to each other, thereby enhancing intermolecular π-π interaction and carrier mobility of the polymer. In 2006, YongFanf Li disclosed a coplanar polythiophene having conjugated side chains in Synthesis and photovoltaic properties of two-dimensional conjugated polythiophenes with bi(thienylenevinylene) side chains, J. H. Hou, Z. A. Tan, Y. Yan, Y. J. He, C. H. Yang, Y. F. Li, *J. Am. Chem. Soc.* 128 (2006) 4911. Li also disclosed that the conjugated side groups may widen the absorption band, resulting in improved power conversion efficiency of the polymer.

BRIEF SUMMARY OF THE INVENTION

The invention provides a soluble polythiophene derivative, having a general formula:

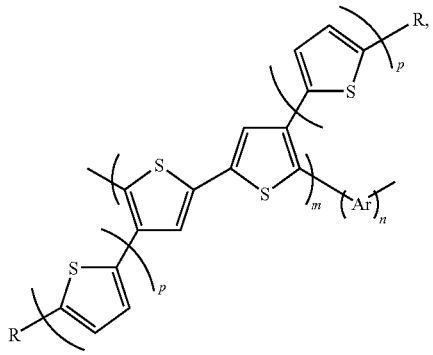

wherein R is selected from a hydrogen, alkyl group, hydroxyl, aldehyde group, ester group, cyano group, nitrogen group, amino group, or substituted or unsubstituted aromatic group; Ar is selected from a substituted or unsubstituted aryl group, substituted or unsubstituted hetero aryl group, or combinations thereof; m is 2 to 100; n is 0 to 100; and p is 1 to 10.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
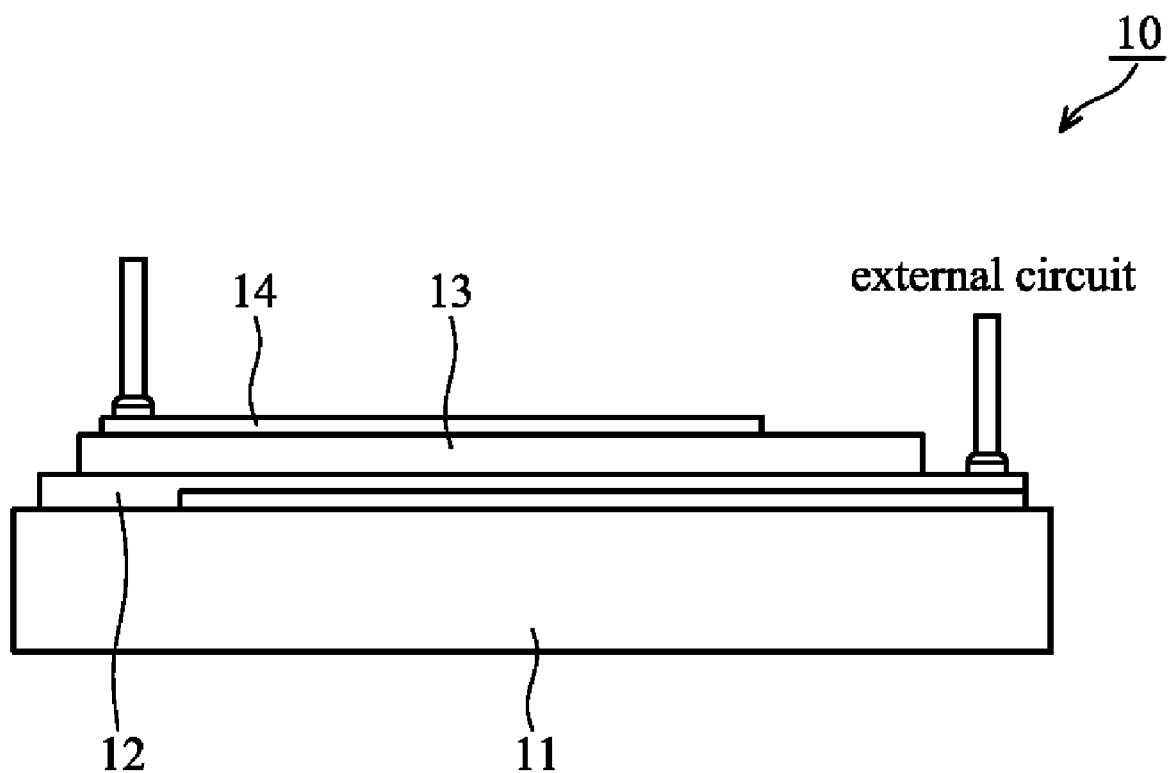
FIG. 1 is cross section of an organic solar cell device in one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides a soluble polythiophene derivative as shown in Formula 1.

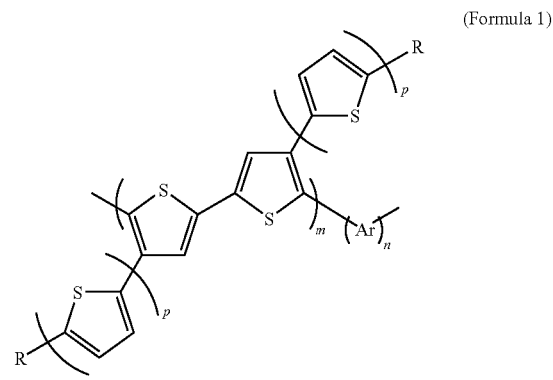

(Formula 1)

In Formula 1, R is selected from a hydrogen, alkyl group, hydroxyl, aldehyde group, ester group, cyano group, nitrogen group, amino group, or substituted or unsubstituted aromatic group such as phenyl, naphthyl, diphenyl, anthryl, pyrenyl, phenanthryl, fluoren, or combinations thereof. Ar is selected from a substituted or unsubstituted aryl group such as phenyl, naphthyl, diphenyl, anthryl, pyrenyl, phenanthryl, fluoren, or combinations thereof; or substituted or unsubstituted hetero aryl group such as pyrane, pyrroline, furan, benzofuran, thiophene, benzothiophene, pyridine, quinoline, isoquinoline, pyrazine, pyrimidine, pyrrole, imidazole, indole, thiazole, isothiazole, oxazole, isoxazole, benzothiazole, benzoxazole, 1,2,4-triazole, 1,2,3-triazole, phenanthroline, oxadiazolopyridine, pyridopyrazine, benzooxadiazole, thiadiazolopyridine, selenophene, tellurophene, thiadiazoloquinoxaline, thienopyrazine, quinoxaline, diketopyrrolopyrrole, or combinations thereof; or combinations thereof. In Formula 1, m is 2 to 100, n is 0 to 100, and p is 1 to 10. In one embodiment, Ar is a sulfur-containing hetero aryl group such as thiophene, dithiophene, benzothiodiazole, or the likes. In one embodiment, the soluble polythiophene derivatives have a molecular weight of 1,000 to 100,000.

In one embodiment, the monomer having conjugated thiophene side chains is copolymerized with other substituted or unsubstituted aryl/hetero aryl groups to form a random copolymer as shown in Formula 2 or alternative copolymers as shown in Formulae 3 and 4.

(Formula 2)

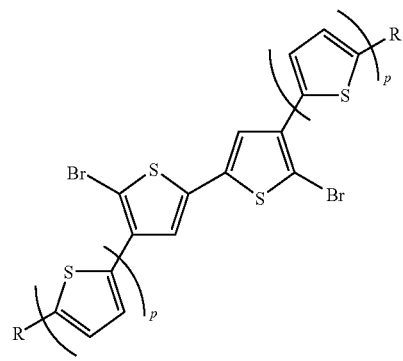

+

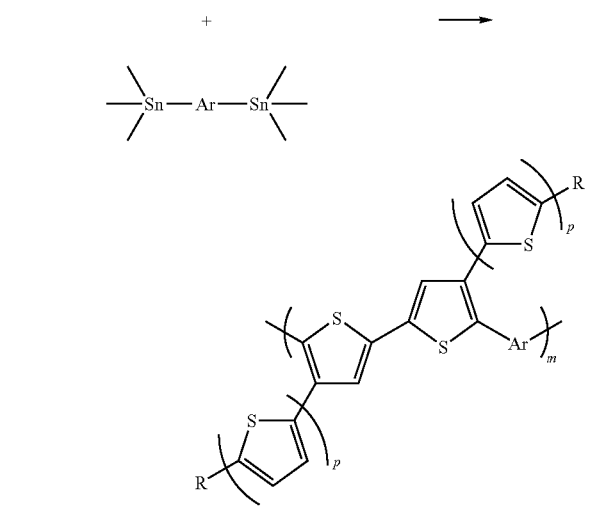

(Formula 3)

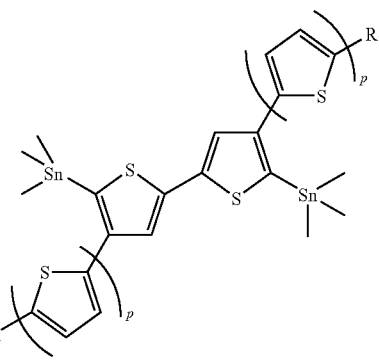

+

Br—Ar—Br

⟶

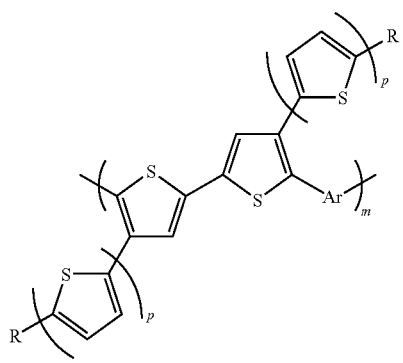

(Formula 4)

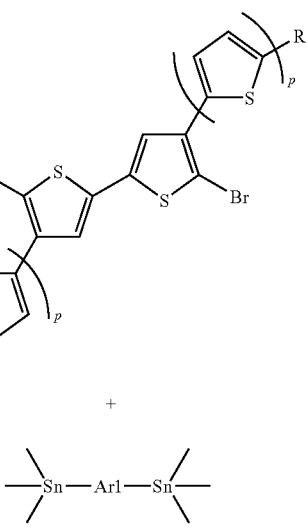

+

Br—Ar1—Br

⟶

Br—Ar2—Br

-continued

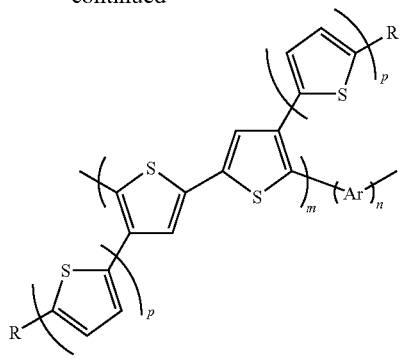

As determined in experiment data, the alternative copolymer is relatively regular due to intramolecular interaction, thereby having higher carrier mobility. On the other hand, the random copolymer is relatively indiscriminate, thereby having higher solubility and benefit in manufacture of photoelectric devices. However, both copolymers have characteristics such as high thermal stability, high carrier mobility, low HOMO value, high open-circuit voltage, and high power conversion efficiency due to the conjugated thiophene side chains.

The described soluble polythiophene derivatives can be applied in an active layer of an organic thin film transistor. The detailed structure and fabrication of an organic TFT is disclosed in U.S. Pat. No. 6,107,117.

The described soluble polythiophene derivatives can be applied in an active layer of an organic light emitting diode. The detailed structure and fabrication of an OLED is disclosed in U.S. Pat. No. 6,488,555.

The described soluble polythiophene derivatives can be applied in an active layer of a solar cell device. The detailed structure and fabrication of a solar cell device is disclosed in U.S. Pat. No. 6,852,920.

The active layer of the described solar cell includes the soluble polythiophene derivatives of the invention and an electron acceptor material such as [6,6]-phenyl-C61-butyric acid methyl ester (abbreviated $PC_{61}BM$) or [6,6]-phenyl-C71-butyric acid methyl ester (abbreviated $PC_{71}BM$). In one embodiment, the soluble polythiophene and the electron acceptor material have a weight ratio of 1:3, such that the solar cell device has high power conversion efficiency.

EXAMPLES

Example 1

Synthesis of a Monomer Having Conjugated Thiophene Side Chains

As shown in Formula 5, 2-hexylthiophene (7.00 g, 41.6 mmol) was dissolved in dry THF and cooled to −78° C., dropwise added 2.5M n-butyl lithium (18.4 mL, 46.0 mmol) under nitrogen, and reacted for 1 hour at −78° C. Subsequently, the solution was added 10 g of trimethyltin chloride (50 mmol) in one potion, and the temperature thereof was slowly raised to room temperature to react for 12 hours. The resulting mixture was added an $Na_2CO_3$ saturated solution, the organic layer was extracted by n-hexane, and the extraction was dried by anhydrous magnesium sulfate. The solvent of the dried extraction was removed by an evaporator rotator, and 8.9 g of the product (65% yield) was obtained by distillation. The product of Formula 5 had a $^1H$ NMR ($CDCl_3$, 500 MHz) spectrum as: 6.98 (d, 1H), 2.80 (t, 2H), 1.68 (m, 2H), 1.33 (m, 4H), 0.84 (t, 3H), 0.32 (s, 9H). $C_6H_{13}$

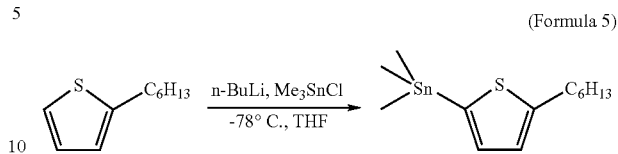

(Formula 5)

As shown in Formula 6, 10.00 g of the product of Formula 5 (30.2 mmol), 4.92 g of 2-bromothiophene (30.2 mmol), and 0.69 g of $Pd(PPH_3)_4$ (0.6 mmol) were dissolved in a co-solvent of DMF (20 mL) and toluene (80 mL). The solution was purged by argon for 10 minutes, heated to 120° C. and reacted for 24 hours under nitrogen, and then cooled to room temperature. The resulting mixture was added water, the organic layer was extracted by n-hexane, and the extraction was dried by anhydrous magnesium sulfate. The solvent of the dried extraction was removed by an evaporator rotator, and 3.9 g of the product (52% yield) was obtained by distillation. The product of Formula 6 had a $^1H$ NMR ($CDCl_3$, 500 MHz) spectrum as: 7.16 (d, 1H), 7.09 (d, 1H), 6.97 (d, 1H), 6.67 (d, 1H), 2.77 (t, 2H), 1.68 (t, 2H), 1.33 (m, 6H), 0.88 (t, 3H).

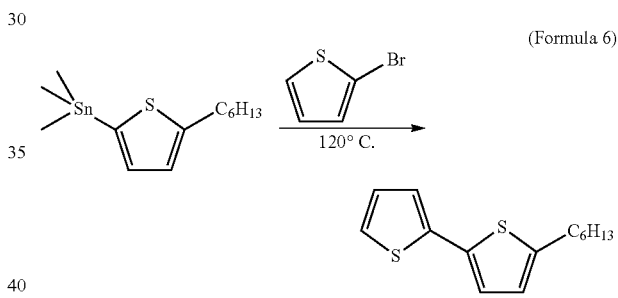

(Formula 6)

As shown in Formula 7, 10 g of the product of Formula 6 (40 mmol) was dissolved in dry THF and cooled to −78° C., dropwise added 2.5M n-butyl lithium (17.6 mL, 44.0 mmol) under nitrogen, and reacted for 1 hour at −78° C. Subsequently, the solution was added 9.6 g of trimethyltin chloride (48 mmol) in one potion, and the temperature thereof was slowly raised to room temperature to react for 12 hours. The resulting mixture was added an $Na_2CO_3$ saturated solution, the organic layer was extracted by n-hexane, and the extraction was dried by anhydrous magnesium sulfate. The solvent of the dried extraction was removed by an evaporator rotator, and 7.9 g of the product (48% yield) was obtained by distillation. The product of Formula 7 had a $^1H$ NMR ($CDCl_3$, 500 MHz) spectrum as: 7.20 (d, 1H), 7.06 (d, 1H), 6.96 (m, 2H), 6.66 (d, 1H), 2.76 (t, 2H), 1.68 (t, 2H), 1.33 (m, 2H), 0.88 (t, 3H).

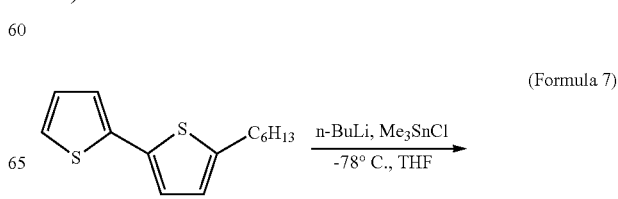

(Formula 7)

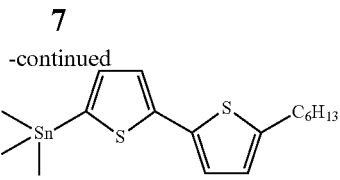

As shown in Formula 8, 21.5 g of 2,4-dibromothiophene (89.9 mmol) was dissolved in dry ether (100 mL), dropwise added solution of 2.5M n-butyl lithium (42 mL, 98 mmol) and dry ether (200 mL) under nitrogen, and stirred and reacted for 15 minutes at −78° C. Subsequently, the solution was added 14.4 g of $CuCl_2$ (107 mmol) in one potion, and the temperature thereof was slowly raised to room temperature to react overnight. The resulting suspension was added water, and the separated organic layer was dried by anhydrous magnesium sulfate. The solvent of the dried organic layer was removed by an evaporator rotator, and 6.05 g of the product (42% yield) was obtained by distillation. The product of Formula 8 had a $^1$H NMR (CDCl$_3$, 500 MHz) spectrum as: 7.15 (d, J=1.2 Hz, 2H), 7.08 (d, J=1.2 Hz, 2H).

(Formula 8)

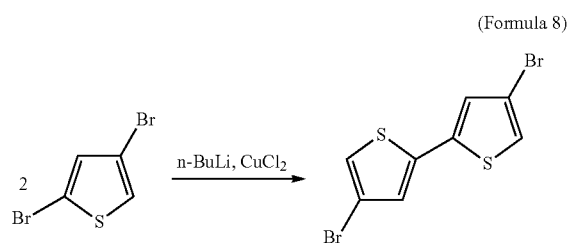

As shown in Formula 9, 1.0 g of the product of Formula 8 (3.0 mmol), 3.2 g of the product of Formula 7 (7.5 mmol) and 0.07 g of Pd(PPH$_3$)$_4$ (0.06 mmol) were dissolved in a co-solvent of DMF (10 mL) and toluene (40 mL). The solution was purged by argon for 10 minutes, heated to 120° C. and reacted for 24 hours under nitrogen, and then cooled to room temperature. The resulting mixture was added water, the organic layer was extracted by 50° C. chloroform, and the extraction was dried by anhydrous magnesium sulfate. The solvent of the dried extraction was removed by an evaporator rotator, and 1.4 g of the product (68% yield) was obtained by vacuum distillation. The product of Formula 9 had a $^1$H NMR (CDCl$_3$, 500 MHz) spectrum as: 7.28 (s, 2H), 7.15 (s, 2H), 6.99 (d, 2H), 6.90 (d, 2H), 6.86 (d, 2H), 6.86 (d, 2H), 2.64 (t, 4H), 1.52 (quint, 4H), 1.18 (m, 12H), 0.74 (t, 6H).

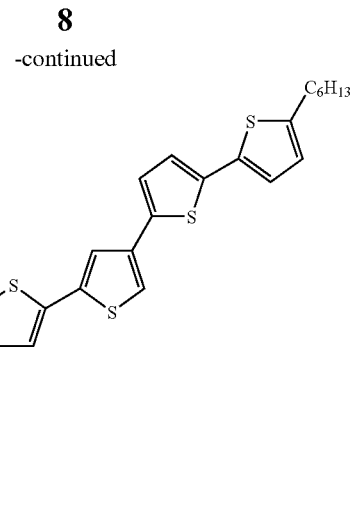

As shown in Formula 10, 3.0 g of the product of Formula 9 (4.5 mmol) was dissolved in a co-solvent of chloroform (30 mL) and glacial acetic acid (10 mL), added 1.61 g NBS (9.00 mmol) at 0° C. in dark, and the temperature thereof was slowly raised to room temperature to react for 12 hours. The resulting mixture was added water, the organic layer was extracted by 50° C. chloroform, and the extraction was dried by anhydrous magnesium sulfate. The solvent of the dried extraction was removed by an evaporator rotator, and 2.85 g of the product (77% yield) was obtained by vacuum distillation. The product of Formula 10 had a $^1$H NMR (CDCl$_3$, 500 MHz) spectrum as: 7.34 (d, 2H), 7.13 (s, 2H), 7.05 (d, 2H), 7.01 (d, 2H), 6.67 (d, 2H), 2.78 (t, 4H), 1.65 (quint, 4H), 1.37 (m, 8H), 0.87 (t, 6H); and a $^{13}$C NMR (CDCl$_3$, 125 MHz) spectrum as: 145.6, 138.15, 136.02, 134.81, 134.26, 134, 127.01, 124.90, 124.44, 123.66, 122.98, 106.91, 31.55, 30.20, 29.71, 28.74, 22.57, 14.04.

(Formula 9)

(Formula 10)

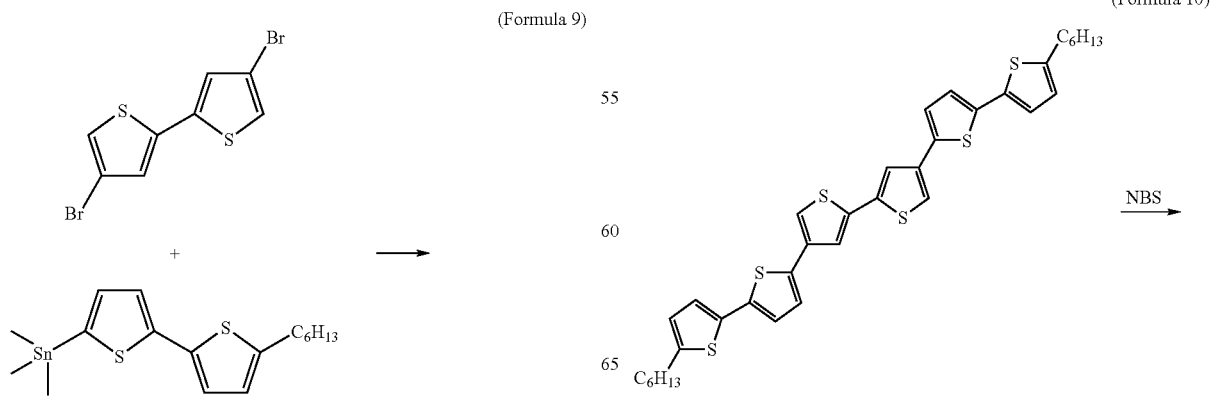

-continued

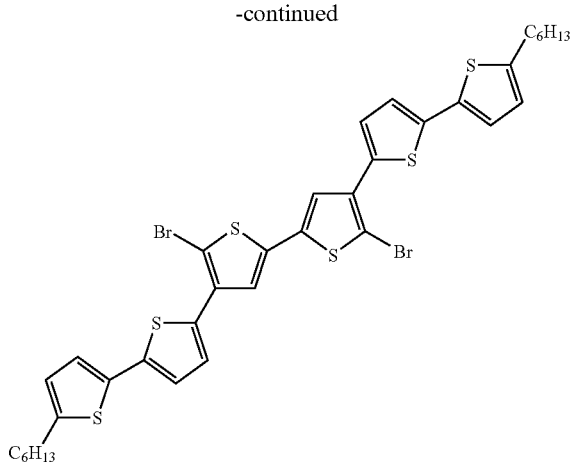

As shown in Formula 11, 0.82 g of the product of Formula 9 (1 mmol) was dissolved in dry THF and cooled to −78° C., dropwise added 2.5M n-butyl lithium (0.88 mL, 2.2 mmol) under nitrogen, and reacted for 1 hour at −78° C. Subsequently, the solution was added 0.48 g of trimethyltin chloride (2.4 mmol) in one potion, and the temperature thereof was slowly raised to room temperature to react for 12 hours. The resulting mixture was added an $Na_2CO_3$ saturated solution, the organic layer was extracted by n-hexane, and the extraction was dried by anhydrous magnesium sulfate. The solvent of the dried extraction was removed by an evaporator rotator, and 0.62 g of the product (62% yield) was obtained by distillation. The product of Formula 11 had a $^1$H NMR ($CDCl_3$, 500 MHz) spectrum as: 7.42 (s, 2H), 7.04 (d, 2H), 6.99 (d, 2H), 6.94 (d, 2H), 6.70 (d, 2H), 2.80 (t, 4H), 1.70 (quint, 4H), 1.39 (m, 8H), 0.91 (t, 6H), 0.38 (s, 18H).

(Formula 11)

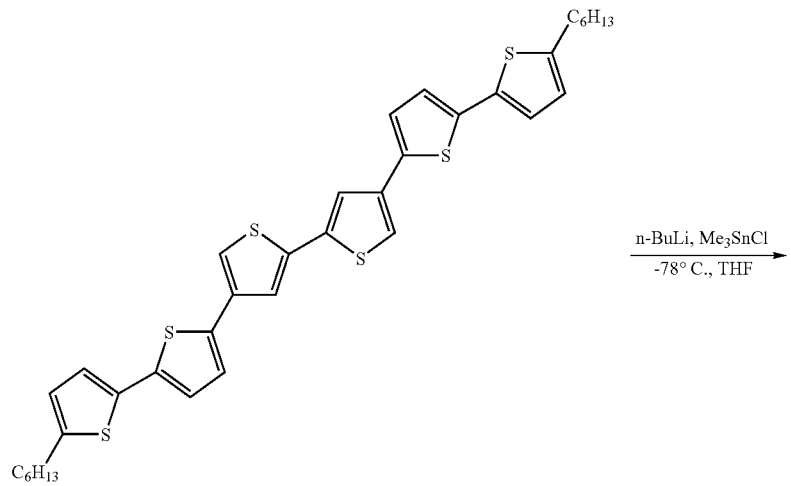

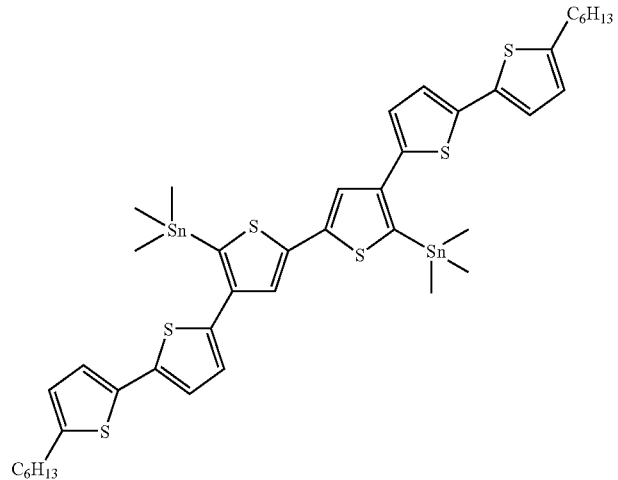

Example 2

Polythiophene Derivatives, Alternative Copolymer

As shown in Formula 3, dibromide such as the product of Formula 10 (0.49 g, 0.6 mmol) and the other dibomides of Formulae 12-14, ditin such as the product of Formula 11 (0.6 mmol) and other sulfur-containing hetero aryl ditin complexes (0.6 mmol) of Formulae 15-17, $Pd_2(dba)_3$ (11 g, 2 mol %), and tri(o-tolyl)phosphine (29.2 mg, 16 mol %) were dissolved in chlorobenzene (10 mL), purged by nitrogen to remove residue oxygen of the solution, and heated by microwave for 30 minutes. The resulting solution was poured to 1 L of methanol to form black precipitate. The black precipitate was washed by Soxhlet extractor with methanol, acetone, and hexane, and the extraction was furthered extracted by chloroform. The chloroform solution was concentrated and re-precipitated by methanol to form red products such as P1 (0.31 g, 68% yield).

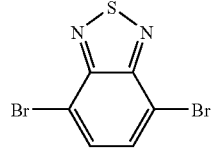

(Formula 12)

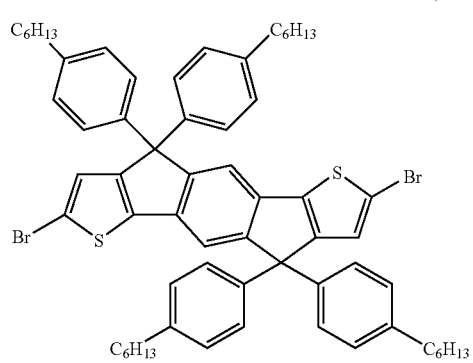

(Formula 13)

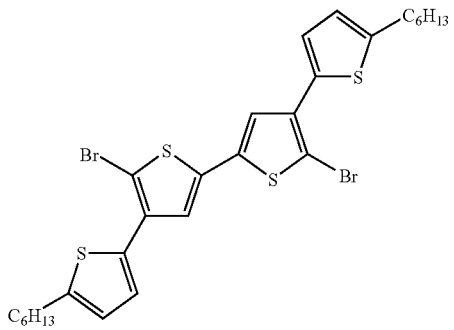

(Formula 14)

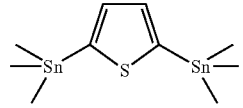

(Formula 15)

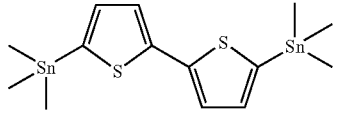

(Formula 16)

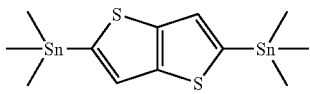

(Formula 17)

TABLE 1

| No. | ditin | dibromide | Product |
|---|---|---|---|
| P1 | Formula 15 | Product of Formula 10 | |

TABLE 1-continued

| No. | ditin | dibromide | Product |
|---|---|---|---|
| P2 | Formula 16 | Product of Formula 10 | |
| P3 | Product of Formula 11 | Formula 12 | |
| P4 | Product of Formula 11 | Formula 13 | |

TABLE 1-continued

| No. | ditin | dibromide | Product |
|---|---|---|---|
| P5 | Formula 15 | Formula 14 | (structure) |
| P6 | Formula 16 | Formula 14 | (structure) |
| P7 | Formula 17 | Formula 14 | (structure) |

Example 3

Polythiophene Derivatives, Random Copolymer

As shown in Formula 4, the product of Formula 10 (0.25 g, 0.3 mmol) and other dibromide as shown in Formula 14, sulfur-containing hetero aryl dibomides (0.3 mmol) as shown in Formula 13, and sulfur-containing hetero aryl ditin complex (0.6 mmol) as shown as Formula 15, $Pd_2(dba)_3$ (11 g, 2 mol %), and tri(o-tolyl)phosphine (29.2 mg, 16 mol %) were dissolved in chlorobenzene (20 mL), purged by nitrogen to remove residue oxygen of the solution, and heated by microwave for 30 minutes. The resulting solution was poured to 1 L of methanol to form black precipitate. The black precipitate was washed by Soxhlet extractor with methanol, acetone, and hexane, and the extraction was furthered extracted by chloroform. The chloroform solution was concentrated and re-precipitated by methanol to form red products such as P8.

TABLE 2

| No. | Monomers having conjugated thiophene side chain | Ar1 | Ar2 | Product |
|---|---|---|---|---|
| P8 | Product of Formula 10 | Formula 15 | Formula 13 | 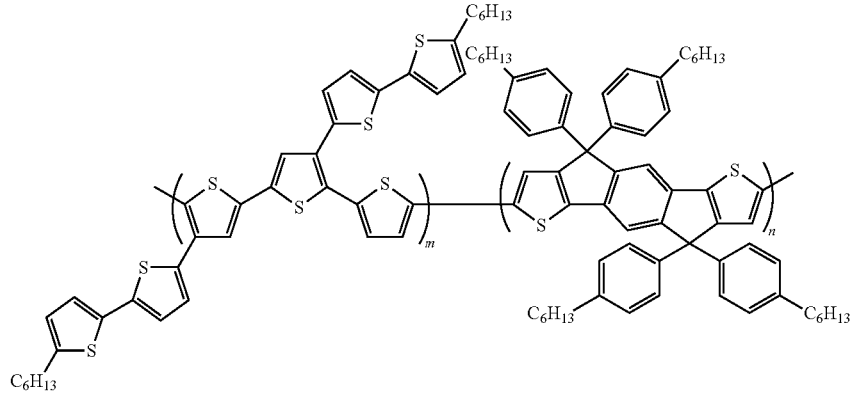 |
| P9 | Formula 14 | Formula 15 | Formula 13 | 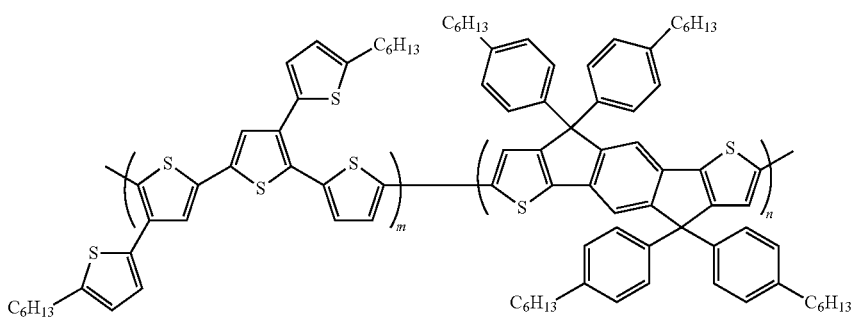 |

Example 4

Solar Cell Device

A solar cell device 10 was prepared as shown in FIG. 1, it included an ITO anode 11, a hole transport layer 12 composed of poly(3,4-ethylenedioxythiophene): poly(styrene-sulfonate) (PEDOT:PSS) overlying the anode 11, an active layer 13 including the soluble polythiophene derivatives overlying the hole transport layer 12, and a cathode 14 composed of Ca/Al.

The active layer 13 was composed of the polythiophene derivatives of the invention and [6,6]-phenyl-C-butyric acid methyl ester (abbreviated PCBM) with a blend ratio of 1:3, wherein the "—C-" could be C61 or C71 derivatives. The solar cell device efficiency was measured under solar luminance of AM 1.5.

The processes of manufacturing the solar cell device were described below.

(1) The active layer solution of polythiophene derivatives and PCBM (1:3, w/w) were prepared and then stirred overnight.

(2) The ITO glass was washed by ultrasonic vibration in acetone and isopropanol for 15 minutes, respectively. The washed glass was blow-dried by nitrogen and baked on a heat plate for 5 minutes.

(3) The baked ITO glass was put under oxygen plasma for 5 minutes.

(4) The PEDOT:PSS (P-VP Al4083, commercially available from Baytron) was spun on (3000 rpm/30 sec.) the ITO-glass to form the hole transport layer, and then baked at 150° C. in dry box for 1 hour.

(5) The active layer solution in step (1) was spun on (1000 rpm/60 sec.) the hole transport layer in the dry box.

(6) The ITO glass was charged on the 140° C. heat plate to anneal for 20 minutes, and then stood and cooled.

(7) The ITO glass was put on the photomask to evaporate a Ca/Al electrode.

(8) The device was sealed to measure its properties such as power conversion efficiency, short-circuit current, open-circuit voltage, and filling factor as shown in Table 3.

TABLE 3

| Active layer | Power conversion efficiency (%) | Short-circuit current (mA/cm$^2$) | Open-circuit voltage (V) | Filling factor |
|---|---|---|---|---|
| P1/PCBM | 2.35 | 7.1 | 0.81 | 0.407 |
| P2/PCBM | 1.51 | 7.01 | 0.552 | 0.402 |
| P3/PCBM | 0.19 | 1.27 | 0.51 | 0.297 |
| P4/PCBM | 4.10 | 8.20 | 0.89 | 0.560 |
| P5/PCBM | 2.54 | 6.40 | 0.91 | 0.430 |
| P6/PCBM | 0.522 | 2.26 | 0.73 | 0.317 |
| P7/PCBM | 0.21 | 1.16 | 0.51 | 0.351 |
| P8/PCBM | 3.36 | 7.56 | 0.87 | 0.514 |
| P9/PCBM | 3.02 | 7.40 | 0.84 | 0.489 |

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A soluble polythiophene derivative, having a general formula selected from the group consisting of:
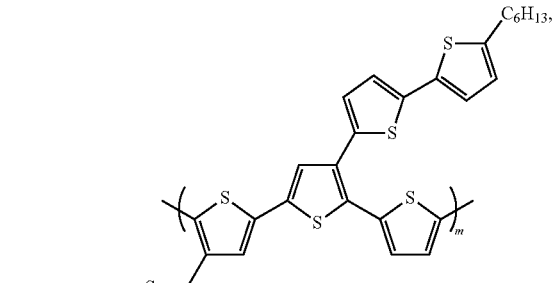
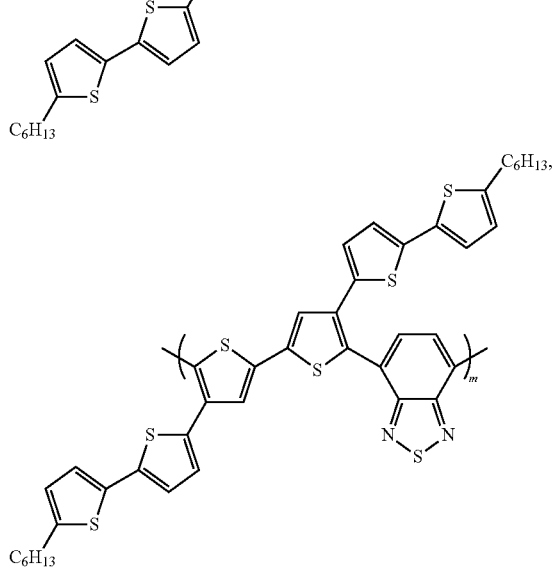
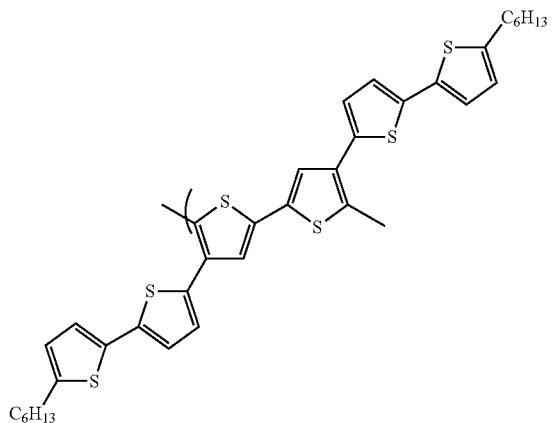
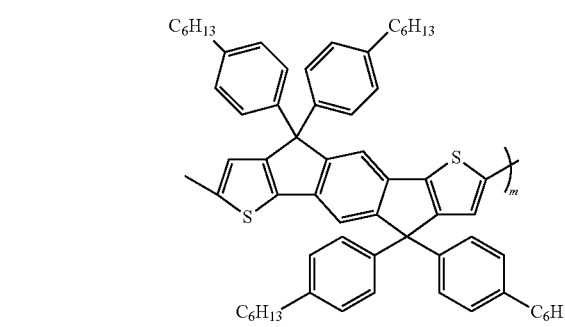
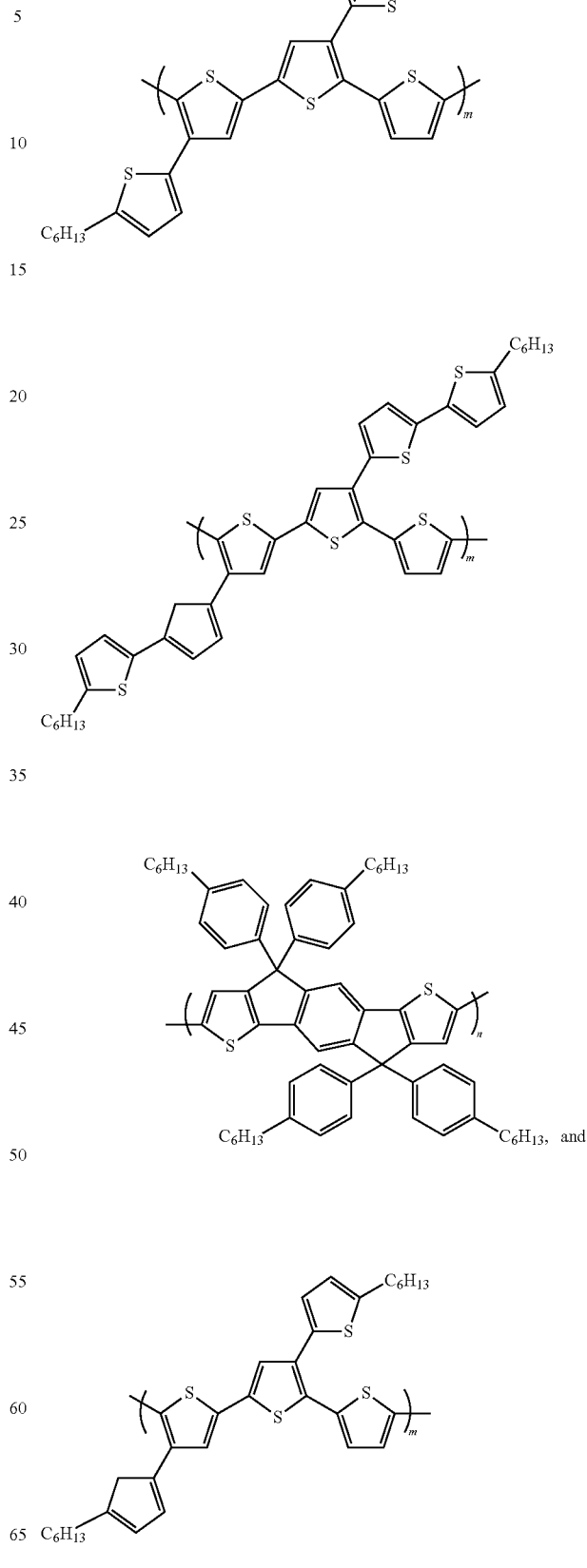

-continued

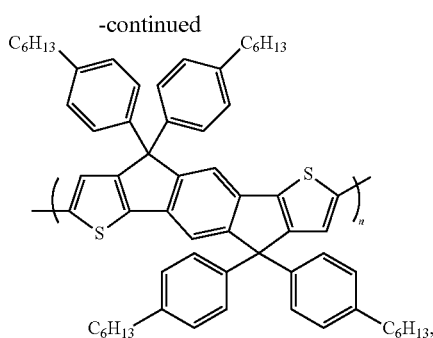

wherein m is 2 to 100; and
n is 0 to 100.

2. The soluble polythiophene derivative as claimed in claim 1 is a random polymer.

3. The soluble polythiophene derivative as claimed in claim 1 is an alternative polymer.

4. The soluble polythiophene derivative as claimed in claim 1, having a general formula:

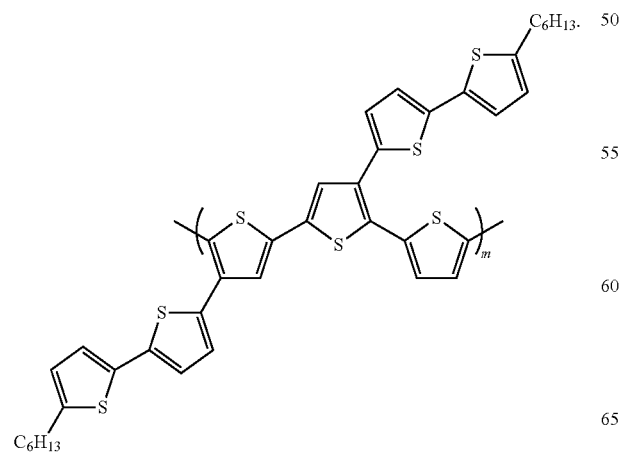

5. The soluble polythiophene derivative as claimed in claim 1, having a general formula:

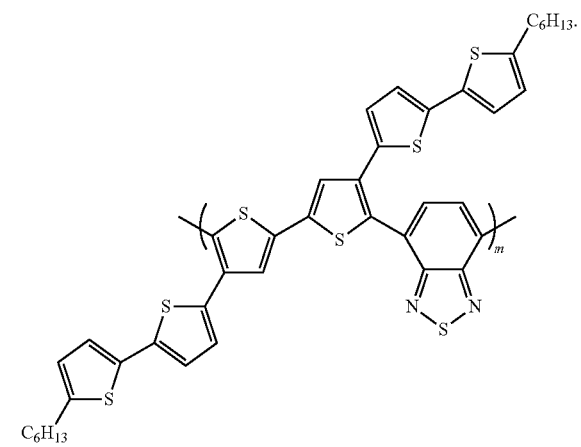

6. The soluble polythiophene derivative as claimed in claim 1, having a general formula:

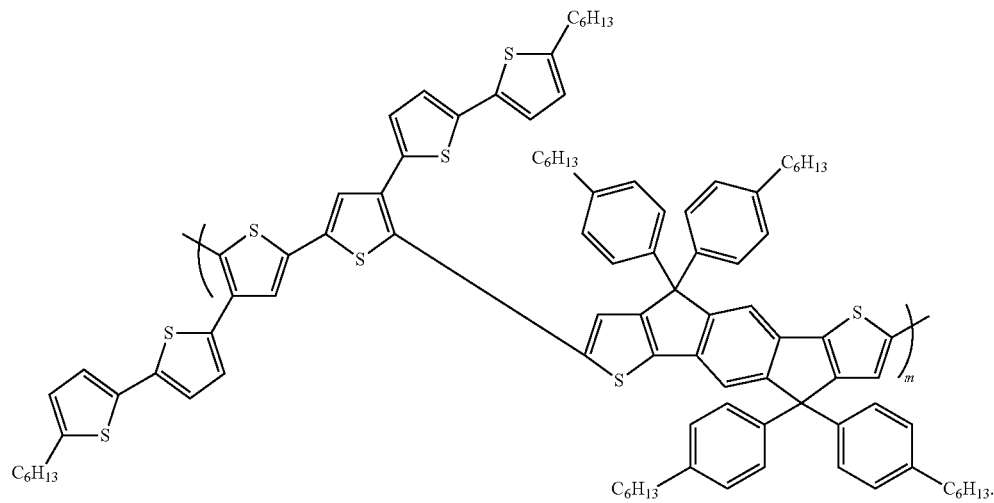

7. The soluble polythiophene derivative as claimed in claim 1, having a general formula:

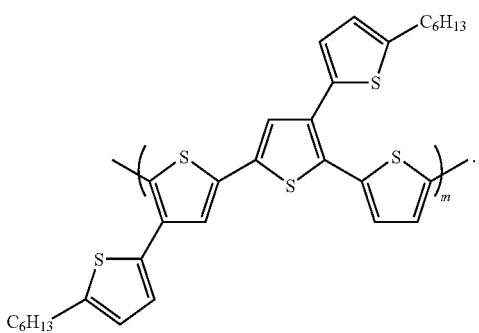

8. The soluble polythiophene derivative as claimed in claim 1, having a general formula:
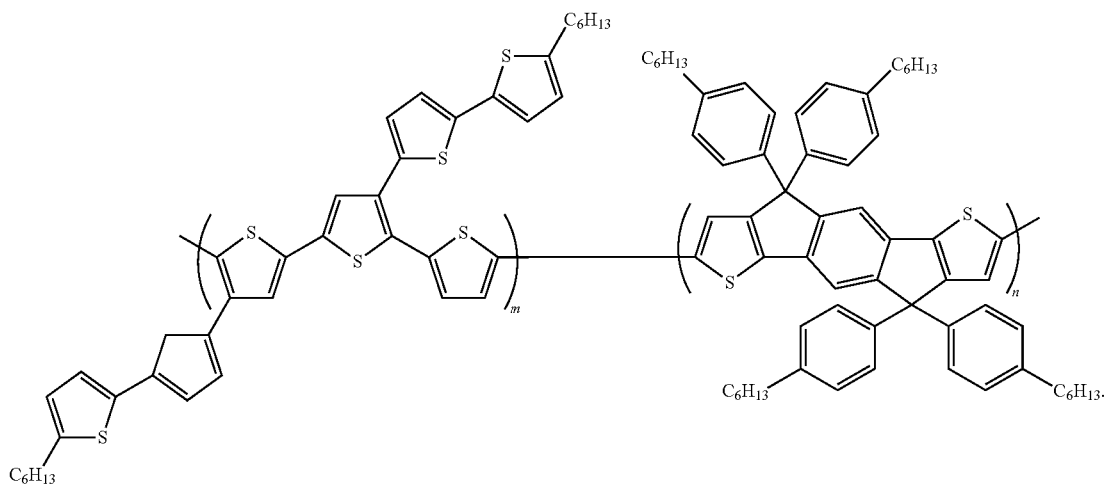
9. The soluble polythiophene derivative as claimed in claim 1, having a general formula:
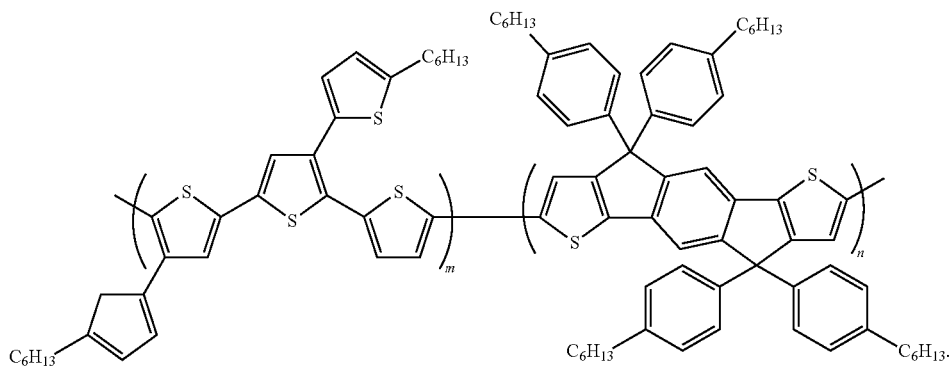
10. A photo-electronic device comprising a soluble polythiophene derivative, having a general formula selected from the group consisting of:
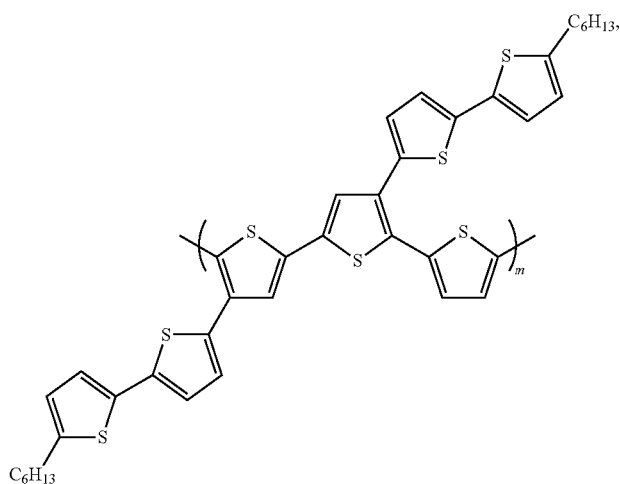

-continued
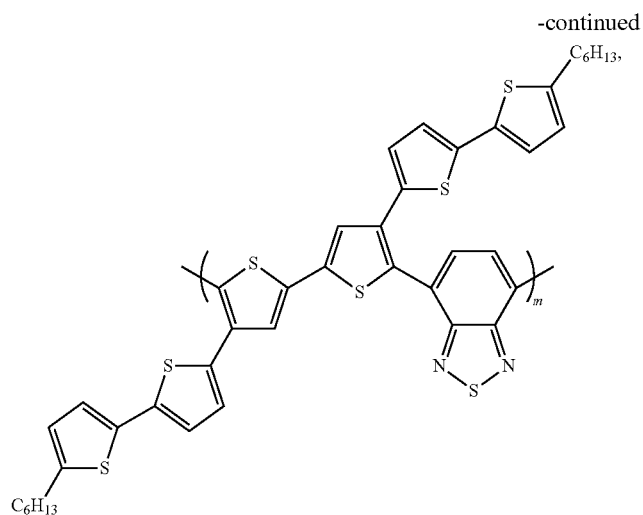
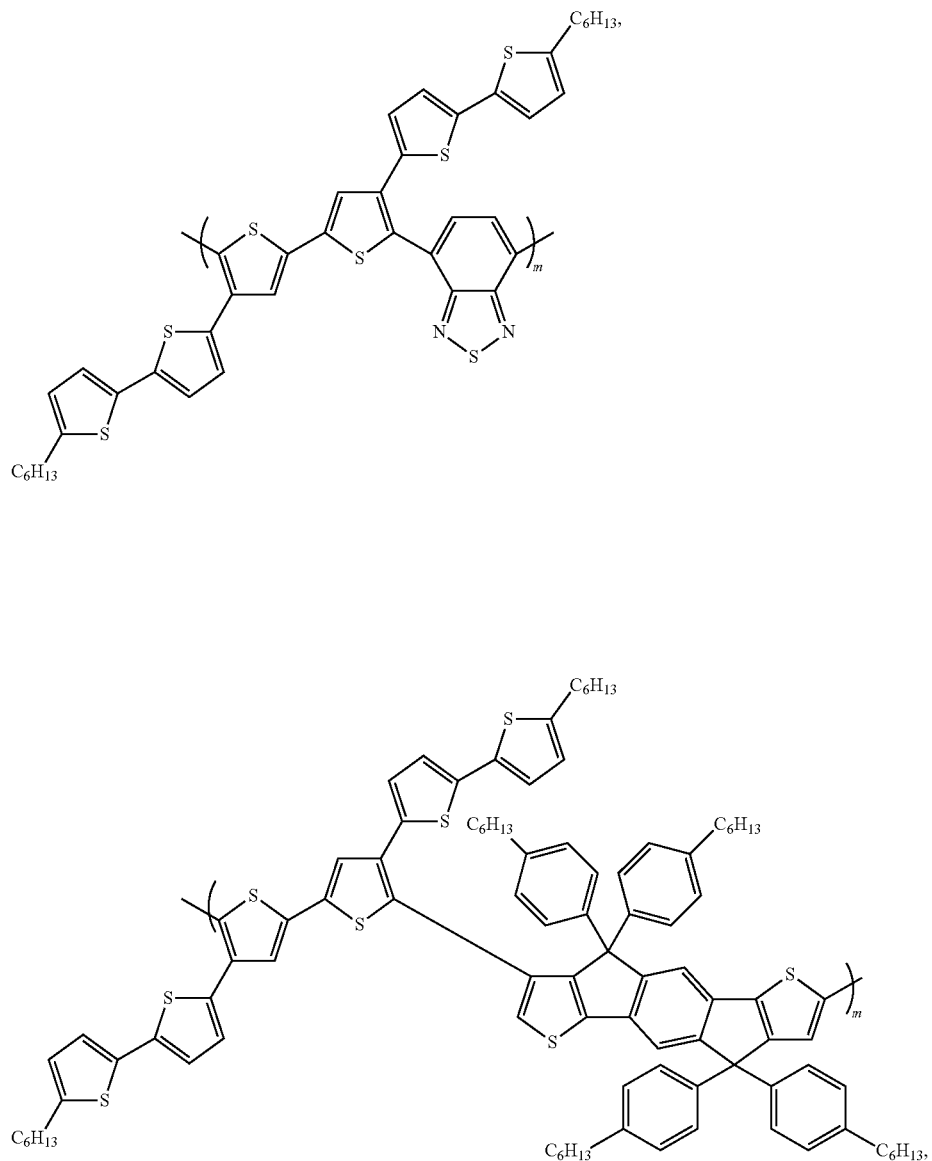
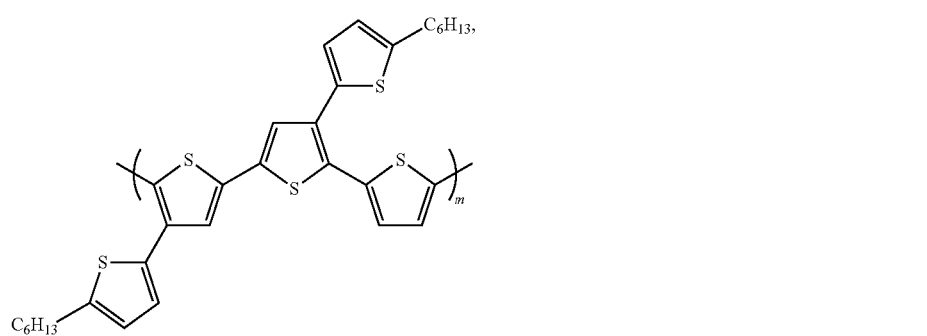

-continued
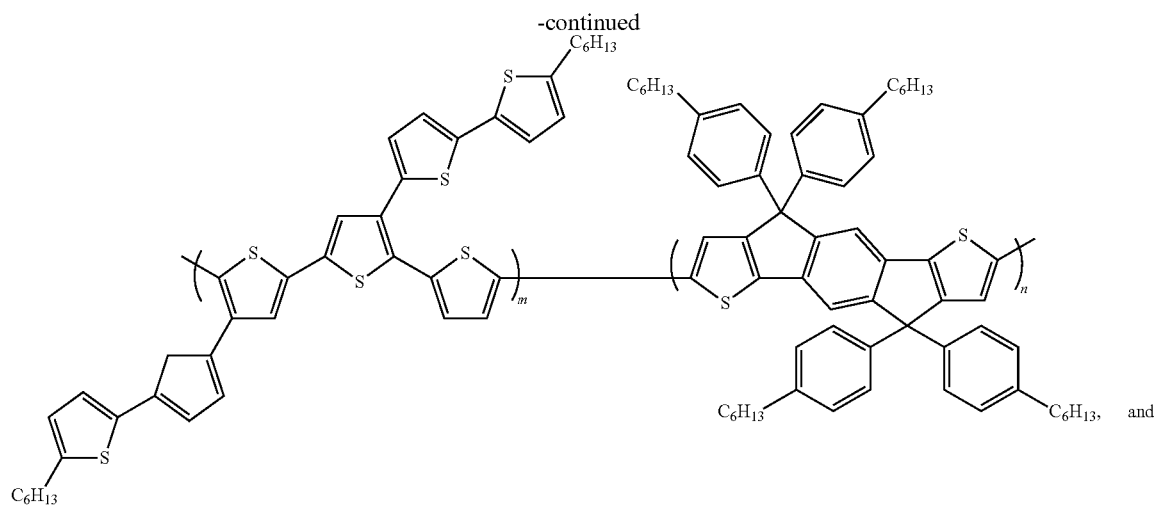
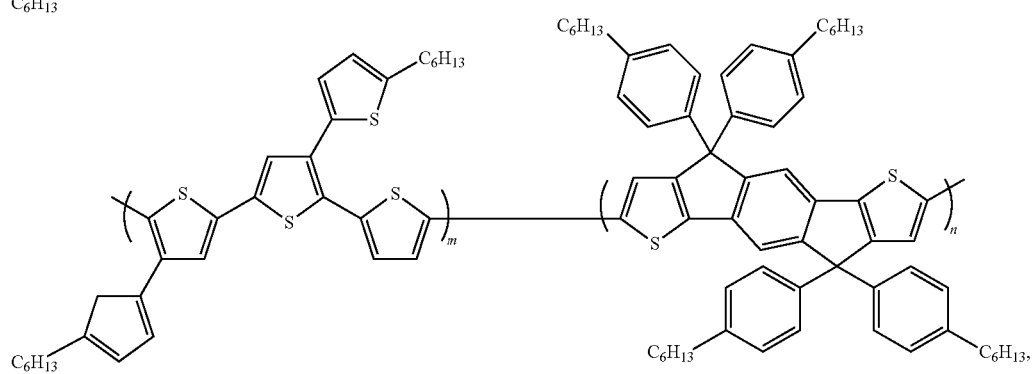
wherein m is 2 to 100; and
n is 0 to 100.
11. The soluble polythiophene derivative as claimed in claim 10, wherein the photo-electronic device comprises organic thin film transistors, organic light-emitting diodes, or organic solar cells.
12. The soluble polythiophene derivative as claimed in claim 1 has a molecular weight of 1,000 to 100,000.
* * * * *